United States Patent
Gallhauser et al.

(10) Patent No.: US 10,852,338 B2
(45) Date of Patent: Dec. 1, 2020

(54) APPARATUS AND METHOD FOR MEASURING RADIO FREQUENCY POWER

(71) Applicant: Rohde & Schwarz GmbH & Co. KG, Munich (DE)

(72) Inventors: Markus Gallhauser, Freising (DE); Werner Perndl, Zorneding (DE); Nino Voss, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 62 days.

(21) Appl. No.: 16/283,118

(22) Filed: Feb. 22, 2019

(65) Prior Publication Data
US 2020/0271707 A1    Aug. 27, 2020

(51) Int. Cl.
G01R 15/08    (2006.01)
G01R 21/12    (2006.01)
G01R 29/08    (2006.01)
H04B 17/10    (2015.01)

(52) U.S. Cl.
CPC ....... G01R 29/0814 (2013.01); H04B 17/102 (2015.01); H03F 2200/451 (2013.01)

(58) Field of Classification Search
CPC ........ G01R 15/08; G01R 21/00; G01R 21/01; G01R 21/12; G01R 31/2872; G01R 31/2884; G01R 31/00; H04B 17/00; H04B 17/101; H04B 17/102; H03F 2200/451
See application file for complete search history.

(56) References Cited

U.S. PATENT DOCUMENTS

| | | | |
|---|---|---|---|
| 9,002,667 B2 | 4/2015 | Reichel et al. | |
| 9,239,344 B2 | 1/2016 | Perndl et al. | |
| 9,586,518 B2 | 3/2017 | Salter et al. | |
| 2009/0322313 A1* | 12/2009 | Zhang | G01R 21/01 324/123 R |
| 2010/0100340 A1* | 4/2010 | Reichel | G01R 21/12 702/61 |
| 2015/0256372 A1* | 9/2015 | Sidiropoulos | H04B 1/0057 375/340 |

* cited by examiner

*Primary Examiner* — Thai Pham
(74) *Attorney, Agent, or Firm* — Ditthavong & Steiner P.C.

(57) ABSTRACT

An apparatus for measuring radio frequency power is provided. The apparatus comprises at least one interface, at least two measurement paths, and a processor. In this context, at least two of the at least two measurement paths are connected to a single interface, whereas the at least two measurement paths are connected to the processor in order to provide measurement data for the processor. In addition to this, the processor is configured to select one of the at least two measurement paths for producing a measuring result on the basis of at least one environmental sensor value from at least one environmental sensor and/or on the basis of at least one user input.

18 Claims, 4 Drawing Sheets

APPARATUS AND METHOD FOR MEASURING RADIO FREQUENCY POWER

TECHNICAL FIELD

The invention relates to an apparatus and a method for measuring radio frequency power, wherein especially a desired measurement path of several measurement paths is selected. In this application, radio frequency does not mean a limitation in frequency range and might cover all frequencies from long wave, medium wave, short wave, ultra-short wave, microwave and millimeter wave, for example.

BACKGROUND ART

Generally, in times of an increasing number of applications providing wireless communication capabilities, there is a growing need of an apparatus and a method for performing radio frequency power measurements with respect to a device under test comprising such an application in order to verify correct functioning of said applications in a highly accurate and efficient manner.

Power meters of the applicant are, for example, disclosed in U.S. Pat. No. 9,568,518 B2, U.S. Pat. No. 9,002,667 B2 and U.S. Pat. No. 9,239,344 B2.

In the context of testing, common measuring devices for performing radio frequency power measurements have always to be calibrated in the case that said measuring device should be used in another measurement environment, which disadvantageously leads to inefficient measurement with special respect to different measurement environments. In addition to this, said frequent recalibration may disadvantageously lead to inaccuracies and measurement errors. As it can be seen, there is neither an apparatus for measuring radio frequency power nor a method for measuring radio frequency power, which could solve the foregoing problem of inaccuracy and inefficiency.

Accordingly, there is a need to provide an apparatus and a method for measuring radio frequency power, whereby both a high accuracy and a high efficiency are ensured.

SUMMARY OF THE INVENTION

According to a first aspect of the invention, an apparatus for measuring radio frequency power is provided. The apparatus comprises at least one interface, at least two measurement paths, and a processor. In this context, at least two of the at least two measurement paths are connected to a single interface of the at least one interface, whereas the at least two measurement paths are connected to the processor in order to provide measurement data for the processor. In addition to this, the processor is configured to select one of the at least two measurement paths for producing a measuring result on the basis of at least one environment sensor value from at least one sensor and/or on the basis of at least one user input. Advantageously, due to the selection of an appropriate measurement path based on an environmental input in the form of a sensor and/or user input, radio frequency power can be measured in a highly accurate and efficient manner.

According to a first preferred implementation form of the first aspect of the invention, the at least one interface comprises or is a connector or an antenna. Advantageously, complexity can be reduced, which leads to an increased efficiency.

According to a second preferred implementation form of the first aspect of the invention, the connection between the at least two of the at least two measurement paths and the single interface of the at least one interface is switchable by a radio frequency switch or fixed by a splitter. Advantageously, for instance, measurement paths, which are not needed, can be switched off, thereby saving energy, and thus increasing efficiency.

According to a further preferred implementation form of the first aspect of the invention, the at least one environmental sensor value comprises data with respect to at least one of temperature, pressure, humidity, vibration, shock, any kind of environmental parameter, or any combination thereof. Advantageously, measurements can be performed in a flexible manner, which leads to an increased efficiency.

According to a further preferred implementation form of the first aspect of the invention, the environmental sensor comprises or is a temperature sensor, a pressure sensor, a humidity sensor, a vibration sensor, a shock sensor, or any kind of an environmental parameter sensor. Advantageously, for instance, complexity can further be increased, which leads to an increased efficiency.

According to a further preferred implementation form of the first aspect of the invention, the apparatus further comprises at least one of the at least one sensor. Advantageously, due to the fact that no external sensor is needed, efficiency can further be increased.

According to a further preferred implementation form of the first aspect of the invention, different measurement paths of the at least two measurement paths comprise different power detectors. Advantageously, each of the at least two measurement paths can be calibrated with respect to a certain measurement environment.

According to a further preferred implementation form of the first aspect of the invention, the different power detectors are optimized for different temperature areas. Advantageously, a specific tempering of the apparatus is not necessary. Further advantageously, each of the at least two measurement paths can be calibrated with respect to a certain measurement temperature.

According to a further preferred implementation form of the first aspect of the invention, the different detectors are optimized for different temperature areas on the basis of different diodes with different diode design in the respective detectors. Advantageously, complexity can be reduced, thereby increasing efficiency.

According to a further preferred implementation form of the first aspect of the invention, the different diodes comprise different temperature characteristics. Advantageously, simplicity can be increased, which leads to an increased efficiency.

According to a second aspect of the invention, a method for measuring radio frequency power is provided. The method comprises the steps of connecting at least two measurement paths to a single interface, connecting the at least two measurement paths to a processor in order to provide measurement data for the processor, and selecting one of the at least two measurement paths for producing a measuring result on the basis of at least one sensor value from at least one environmental sensor and/or on the basis of at least one user input with the aid of the processor. Advantageously, due to the selection of an appropriate measurement path based on an environmental input in the form of a sensor and/or user input, radio frequency power can be measured in a highly accurate and efficient manner.

According to a first preferred implementation form of the second aspect of the invention, the single interface comprises or is a connector or an antenna. Advantageously, complexity can be reduced, which leads to an increased efficiency.

According to a second preferred implementation form of the second aspect of the invention, the connection between the at least two measurement paths and the single interface is switchable by a radio frequency switch or fixed by a splitter. Advantageously, for instance, measurement paths, which are not needed, can be switched off, thereby saving energy, and thus increasing efficiency.

According to a further preferred implementation form of the second aspect of the invention, the at least one environmental sensor value comprises data with respect to at least one of temperature, pressure, humidity, vibration, shock, any kind of environmental parameter, or any combination thereof. Advantageously, measurements can be performed in a flexible manner, which leads to an increased efficiency.

According to a further preferred implementation form of the second aspect of the invention, the environmental sensor comprises or is a temperature sensor, a pressure sensor, a humidity sensor, a vibration sensor, a shock sensor, or any kind of an environmental parameter sensor. Advantageously, for instance, complexity can further be increased, which leads to an increased efficiency.

According to a further preferred implementation form of the second aspect of the invention, different measurement paths of the at least two measurement paths comprise different power detectors. Advantageously, each of the at least two measurement paths can be calibrated with respect to a certain measurement environment.

According to a further preferred implementation form of the second aspect of the invention, the method further comprises the step of optimizing the different detectors for different temperature areas. Advantageously, a specific tempering of the apparatus is not necessary. Further advantageously, each of the at least two measurement paths can be calibrated with respect to a certain measurement temperature.

According to a further preferred implementation form of the second aspect of the invention, the method further comprises the step of optimizing the different detectors for different temperature areas on the basis of different diodes with different diode design in the respective detectors. Advantageously, complexity can be reduced, thereby increasing efficiency.

BRIEF DESCRIPTION OF THE DRAWINGS

Exemplary embodiments of the invention are now further explained with respect to the drawings by way of example only, and not for limitation. In the drawings.

DETAILED DESCRIPTION OF THE PREFERRED EMBODIMENTS

Figure 1:
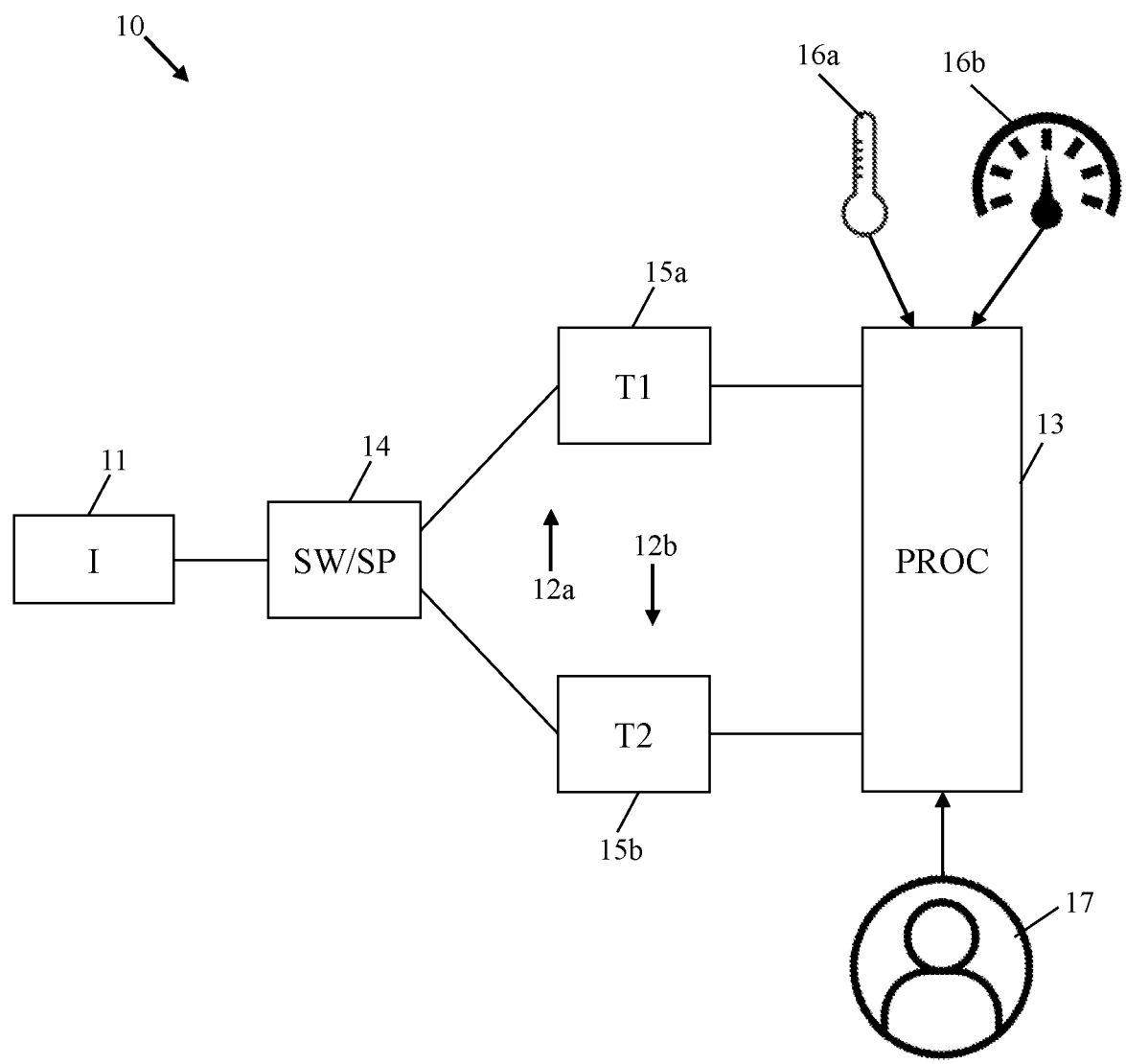
FIG. 1 shows an exemplary embodiment of the first aspect of the invention.

Firstly, FIG. 1 illustrates an exemplary embodiment of the inventive apparatus 10 for measuring radio frequency power. Said apparatus 10 comprises at least one interface, exemplarily the single interface 11, at least two measurement paths, exemplarily the two measurement paths 12a, 12b, and a processor 13. In this context, the two measurement paths 12a, 12b are connected to the single interface 11. Furthermore, the two measurement paths 12a, 12b are connected to the processor 13 in order to provide measurement data for the processor 13. In addition to this, the processor 13 selects one of the two measurement paths 12a, 12b for producing a measuring result on the basis of at least one sensor value from at least one sensor, exemplarily a temperature sensor 16a and a pressure sensor 16b, and/or on the basis of at least one user input, exemplarily user input 17.

It is noted that it might be particularly advantageous if the single interface 11 comprises or is a connector or an antenna.

Furthermore, the connection between the two measurement paths 12a, 12b and the single interface 11 is exemplarily switchable by a radio frequency switch or fixed by a splitter, which is represented by switch/split unit 14.

With respect to the above-mentioned sensor value, it is generally noted that the at least one sensor value may preferably comprise data with respect to at least one of temperature, pressure, humidity, vibration, shock, any kind of environmental parameter, or any combination thereof.

Moreover, it is generally noted that it might be particularly advantageous if the at least one sensor comprises or is an environmental sensor.

In this context, the environmental sensor may preferably comprise or is a temperature sensor such as the temperature sensor 16a, a pressure sensor such as the pressure sensor 16b, a humidity sensor, a vibration sensor, a shock sensor, or any kind of an environmental parameter sensor.

Furthermore, it should be mentioned that it might be particularly advantageous if the apparatus 10 additionally comprises at least one of the at least one sensor.

As it can further be seen from FIG. 1, the two measurement paths 12a, 12b comprise different detectors 15a, 15b, especially power detectors. In addition to this, the different detectors 15a, 15b are optimized for different temperature areas.

In this context, it might be particularly advantageous if the different detectors 15a, 15b are optimized for different temperature areas on the basis of different diodes with different diode design in the respective detectors. It is further noted that the different diodes 15a, 15b may preferably comprise different temperature characteristics.

Figure 2:
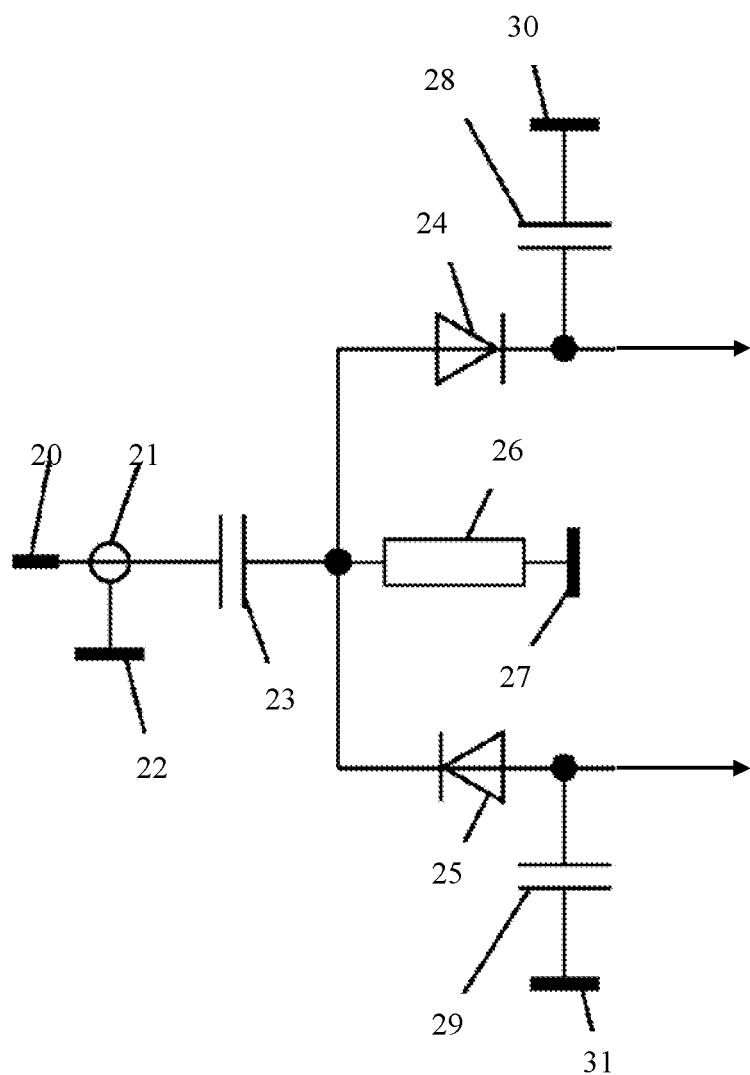
FIG. 2 shows an exemplary embodiment of an input circuit of an interface of the invention.

Now, with respect to the above-mentioned at least one interface or the single interface 11, respectively, an exemplary embodiment of a respective input circuit of said interface is illustrated by FIG. 2.

Said input circuit contains a signal input 20 which is embodied for the feeding in of a measurement signal. Furthermore, it contains a ground input 21 to which a shielding of the connecting cable, which carries the measurement signal, can be connected. The ground input 21 is connected to an internal ground terminal 22. The signal input 20 is connected to a coupling capacitor 23. In turn, the capacitor 23 is connected at its terminal facing away to a first detector diode 24, a resistor 26 and a second detector diode 25. The detector diodes 24 and 25 are configured in this context in an antiparallel manner. That is, from the perspective of the capacitor 23, the first detector diode 24 is connected in the flow direction, while the second detector diode 25 is connected opposite to the flow direction. In other words, the anode of the first diode 24 is connected to the capacitor 23 and/or the resistor 26, while the cathode of the second diode 25 is connected to the capacitor 23 and/or the resistor 26.

The resistor 26, which acts as an absorber for the measurement signal arriving at the signal input 20, is connected at its end facing away to a ground terminal 27. The terminal of the first detector diode 24 facing away from the capacitor 23, here the cathode, is connected to a first load capacitor 28 connected to a ground terminal 30. The terminal of the detector diode 25 facing away from the capacitor 23, here the anode, is also connected to a ground terminal 31 by means of a second load capacitor 29.

Figure 3:
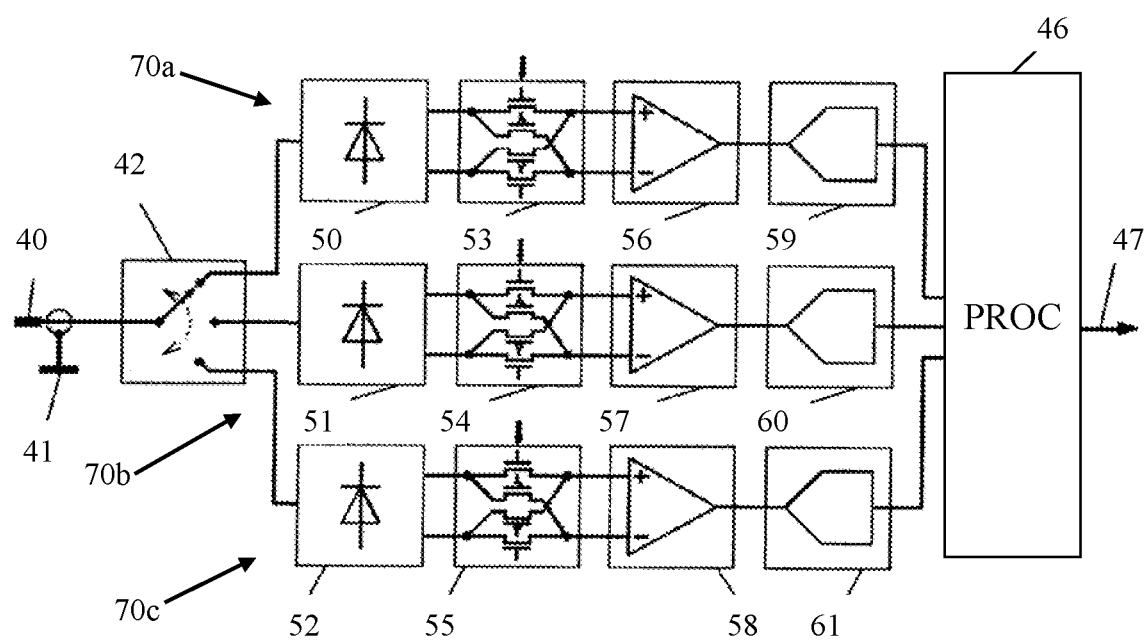
FIG. 3 shows a further exemplary embodiment of the inventive apparatus for measuring radio frequency power.

Moreover, in accordance with FIG. 3, a further exemplary embodiment of the inventive apparatus for measuring radio frequency power is depicted. Said apparatus according to FIG. 3 contains an input connection 40, a ground connection 41, a switch. 42, several measurement paths 70*a*, 70*b*, and 70*c*, a processor 46, and an output connection 47.

All of the measurement paths 70*a*, 70*b*, and 70*c* contain respectively one power detector 50, 51, or 52, respectively one chopper 53, 54, or 55, respectively one difference amplifier 56, 57, or 58 and one analog/digital converter 59, 60, or 61.

A high-frequency signal is supplied via the input connection 40. The screening of the line, by means of which the high-frequency signal is supplied, is connected in this context to the ground connection 41. Dependent upon the level of the high-frequency signal, the switch 42 switches the high-frequency signal to one of the measurement paths 70*a*, 70*b*, or 70*c*.

The power detectors 50, 51, and 52 of the individual measurement paths 70*a*, 70*b*, and 70*c* in this exemplary embodiment are of different structure. The detectors therefore also provide a different characteristic. In this context, it might be particularly advantageous if the detectors especially provide a different temperature characteristic.

After a rectification of the test signal has been implemented by the respectively-used detector 50, 51, and 52, the rectified test signal is routed to the respective chopper 53, 54, and 55. This preferably multiplies the signal by a rectangular signal of the value +1 and −1. This step may be used to compensate zero errors of the amplifier 56, 57, or 58 and the analog/digital converter 59, 60, or 61 of the respective measurement path 70*a*, 70*b*, or 70*c*.

The chopped test signal is then routed to the amplifier 56, 57, and 58 of the respective measurement path 70*a*, 70*b*, and 70*c*, which amplifier is preferably a differential amplifier. This may especially raise the level of the signal to an optimum level for the subsequent analog/digital conversion.

The signal is routed to the analog/digital converter 59, 60, or 61 of the respective measurement path 70*a*, 70*b*, or 70*c*. This digitizes the signal and communicates the signal to the processor 46 exemplarily being a digital signal-processing device. This outputs the signal via the output connection 47.

Accordingly, the output signals, especially the output voltages of the analog/digital converters 59, 60, and 61 are processed in the signal-processing device 46 in parallel by separate conditioning circuits.

Through the use of separate detectors 50, 51, and 52 and separate analog/digital converters 59, 60, and 61, it possible to dispense with an output-end switch. This advantageously avoids the negative effects of an output-end switch on the accuracy and speed of the measurement.

Figure 4:
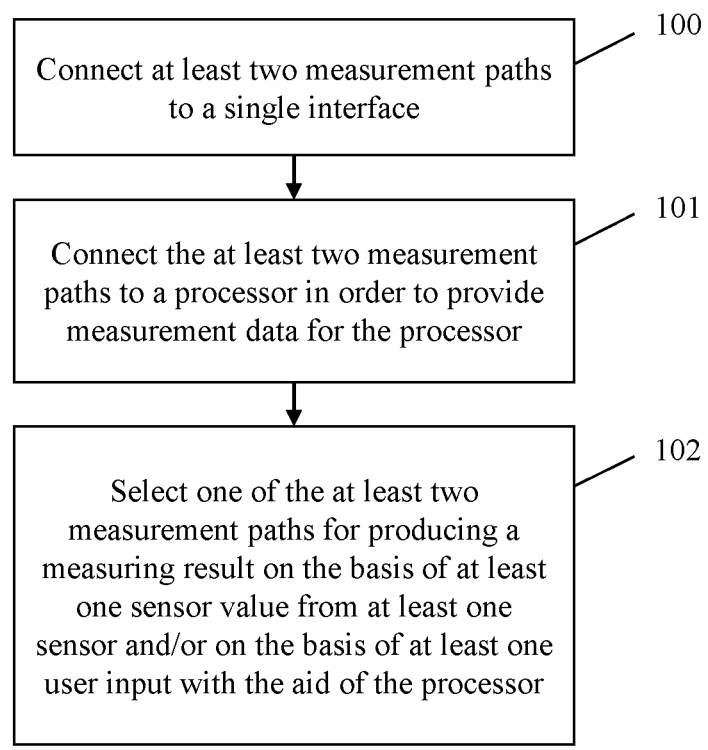
FIG. 4 shows a flow chart of an exemplary embodiment of the second aspect of the invention.

Finally, FIG. 4 shows a flow chart of an exemplary embodiment of the inventive method for measuring radio frequency power. In a first step 100, at least two measurement paths are connected to a single interface. Then, in a second step 101, the at least two measurement paths are connected to a processor in order to provide measurement data for the processor. Furthermore, in a third step 102, one of the at least two measurement paths is selected for producing a measuring result on the basis of at least one sensor value from at least one sensor and/or on the basis of at least one user input with the aid of the processor.

In this context, it might be particularly advantageous if the single interface comprises or is a connector or an antenna.

Furthermore, the connection between the at least two measurement paths and the single interface may preferably be switchable by a radio frequency switch or fixed by a splitter.

Moreover, it is noted that the at least one sensor value may preferably comprise data with respect to at least one of temperature, pressure, humidity, vibration, shock, any kind of environmental parameter, or any combination thereof. In addition to this, it might be particularly advantageous if the at least one sensor comprises or is an environmental sensor.

With respect to the environmental sensor, it is noted that the environmental sensor may preferably comprise or be a temperature sensor, a pressure sensor, a humidity sensor, a vibration sensor, a shock sensor, or any kind of an environmental parameter sensor. Furthermore, it might be particularly advantageous if different measurement paths of the at least two measurement paths comprise different power detectors and/or different sensors.

In this context, the method may further comprise the step of optimizing the different detectors for different temperature areas. In addition to this or as an alternative, the method may further comprise the step of optimizing the different detectors for different temperature areas on the basis of different diodes with different diode design in the respective detectors.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. An apparatus for measuring radio frequency power, the apparatus comprising:
   at least one interface,
   at least two measurement paths, and
   a processor,
   wherein the at least two measurement paths are connected to a single interface,
   wherein the at least two measurement paths are connected to the processor in order to provide measurement data for the processor, and
   wherein the processor is configured to select one of the at least two measurement paths for producing a measuring result on the basis of at least one environmental sensor value from at least one environmental sensor or on the basis of at least one user input.

2. The apparatus according to claim 1,
wherein the at least one interface comprises a connector or an antenna.

3. The apparatus according to claim 1,
wherein a connection between the at least two measurement paths and the single interface is switchable by a radio frequency switch or fixed by a splitter.

4. The apparatus according to claim 1,
wherein the at least one environmental sensor value comprises data with respect to at least one of temperature, pressure, humidity, vibration, shock, or a combination thereof.

5. The apparatus according to claim 1,
wherein the environmental sensor comprises a temperature sensor, a pressure sensor, a humidity sensor, a vibration sensor, a shock sensor, or a combination thereof.

6. The apparatus according to claim 1,
wherein the at least two measurement paths having different measurement paths and comprise different power detectors.

7. The apparatus according to claim 6,
wherein the different power detectors are configured for different temperature areas.

8. The apparatus according to claim 7,
wherein the different power detectors are configured for different temperature areas on the basis of different detector diodes with different diode designs in the respective detectors.

9. The apparatus according to claim 8,
wherein the different diodes arranged in different measurement paths having different temperature characteristics.

10. A method for measuring radio frequency power, the method comprising the steps of:
connecting at least two measurement paths to a single interface,
connecting the at least two measurement paths to a processor in order to provide measurement data for the processor, and
selecting one of the at least two measurement paths for producing a measuring result on the basis of at least one environmental sensor value from at least one environmental sensor or on the basis of at least one user input with the aid of the processor.

11. The method according to claim 10,
wherein the single interface comprises a connector or an antenna.

12. The method according to claim 10,
wherein a connection between the at least two measurement paths and the single interface is switchable by a radio frequency switch or fixed by a splitter.

13. The method according to claim 10,
wherein the at least one environmental sensor value comprises data with respect to at least one of temperature, pressure, humidity, vibration, shock, or a combination thereof.

14. The method according to claim 10,
wherein the environmental sensor comprises a temperature sensor, a pressure sensor, a humidity sensor, a vibration sensor, a shock sensor, or a combination thereof.

15. The method according to claim 10,
wherein the at least two measurement paths having different measurement paths and comprise different power detectors.

16. The method according to claim 15,
wherein the method further comprises the step of configuring the different power detectors for different temperature areas.

17. The method according to claim 16,
wherein the method further comprises the step of configuring the different power detectors for different temperature areas on the basis of different diodes with different diode designs in the respective detectors.

18. The method according to claim 17,
wherein the method further comprises the step of selecting diodes with different temperature characteristics for the different measurement paths.

* * * * *